(12) United States Patent
Sato et al.

(10) Patent No.: US 6,914,387 B2
(45) Date of Patent: Jul. 5, 2005

(54) DRIVING CIRCUIT FOR A LIGHT EMITTING ELEMENT

(75) Inventors: Masahiro Sato, Yokohama (JP); Mitsuaki Nishie, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 75 days.

(21) Appl. No.: 10/431,588

(22) Filed: May 8, 2003

(65) Prior Publication Data

US 2003/0231853 A1 Dec. 18, 2003

(30) Foreign Application Priority Data

May 8, 2002 (JP) ........................................ 2002-133243
May 8, 2002 (JP) ........................................ 2002-133244

(51) Int. Cl.$^7$ ................................................ G09G 3/10
(52) U.S. Cl. ............................... 315/169.1; 315/169.3; 315/291; 372/38.02; 372/38.07; 372/29.015; 372/26
(58) Field of Search ........................... 315/169.3, 169.1, 315/291, 308; 372/26, 29.012, 29.014, 29.015, 38.02, 38.07; 365/185.18, 185.19, 185.23, 230.06; 327/108

(56) References Cited

U.S. PATENT DOCUMENTS

| | | | |
|---|---|---|---|
| 6,362,910 B1 | * | 3/2002 | Tokita ........................ 398/183 |
| 6,580,657 B2 | * | 6/2003 | Sanford et al. ......... 365/230.05 |
| 6,597,209 B2 | * | 7/2003 | Iguchi et al. ............... 327/108 |
| 2002/0131358 A1 | * | 9/2002 | Nagara ....................... 369/116 |

FOREIGN PATENT DOCUMENTS

JP    P2000-138415 A    5/2000

* cited by examiner

Primary Examiner—Haissa Philogene
(74) Attorney, Agent, or Firm—McDermott Will & Emery LLP

(57) ABSTRACT

It is an object of the present invention to provide a driving circuit which can drive a light emitting element in spite of a reduced power supply voltage and which is thus suitable for size reduction. The present invention provides a driving circuit which supplies a bias current to a light emitting element and which carries out modulation on the basis of voltage driving, the driving circuit comprising a boosting circuit that increases a power supply voltage Vcc, a resistance element connected between an output of the boosting circuit and an anode terminal of the light emitting element, and a capacitive element connected to the anode terminal of the light emitting element to supply a modulation signal to the light emitting element for voltage driving.

9 Claims, 8 Drawing Sheets

DRIVING CIRCUIT FOR A LIGHT EMITTING ELEMENT

This application claims priority from Japanese Patent Application Nos. 2002-133243 and 2002-133244 both filed May 8, 2002, which are incorporated hereinto by reference.

BACKGROUND OF THE INVENTION

1. Field of the Invention

The present invention relates to a driving circuit, and more specifically, to a driving circuit used to drive a light emitting element in an optical transmitter that requires a reduced power supply voltage.

2. Description of the Related Art

An optical transmission system using an optical fiber as a transmission line is used for various applications. An optical transmitter in the optical transmission system comprises a light emitting element, a driving circuit that drives the light emitting element, and an encoding circuit that converts an input data signal into an output signal suitable for transmission to input the driving circuit. In recent years, applications for short-distance transmission system have required a transmission speed of 1 Gbps or more and thus an optical transmitter suitable for an increased transmission speed. On the other hand, a reduced power supply voltage improves reduction of current consumption and heat generation.

Figure 1:
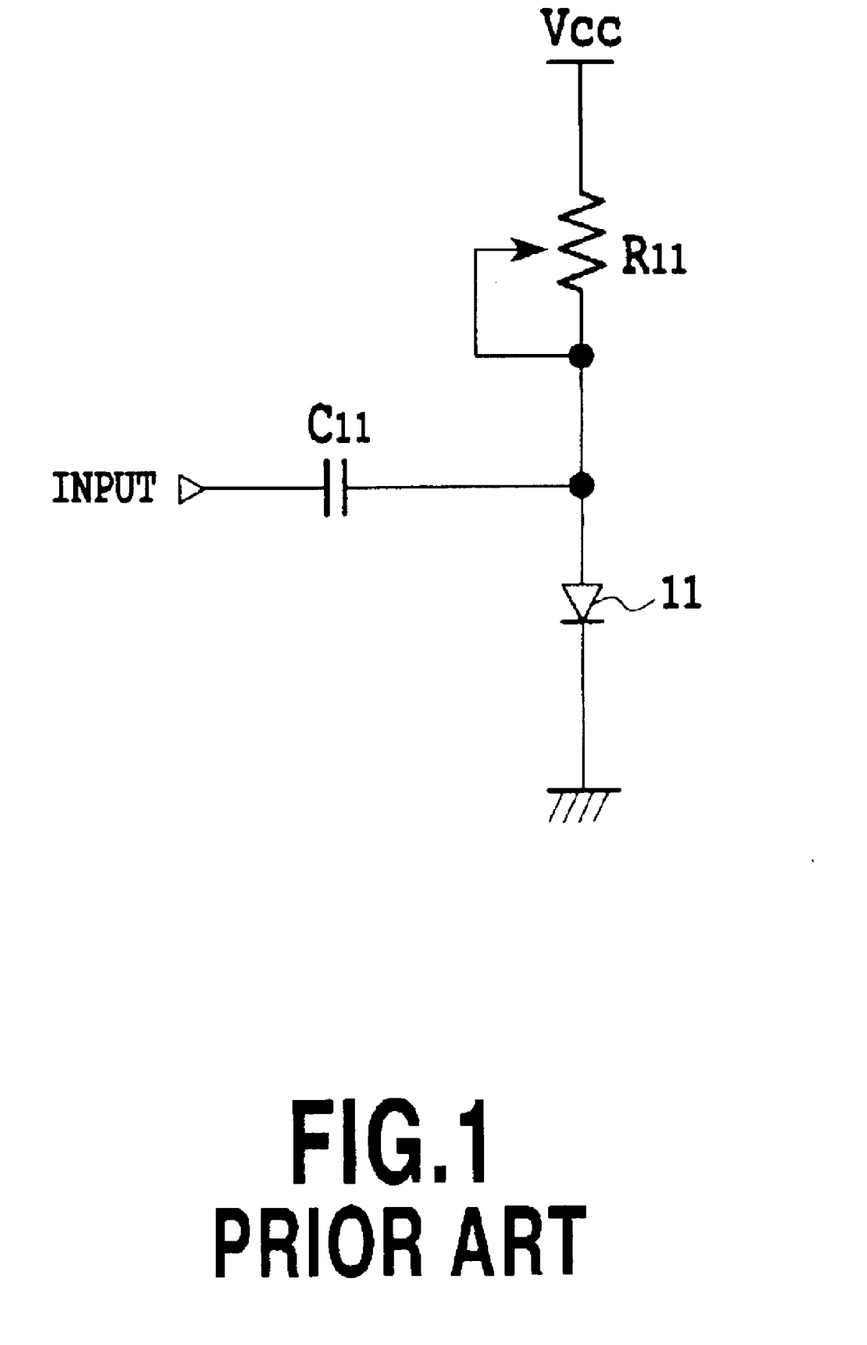
FIG. 1 is a circuit diagram showing a configuration of a conventional driving circuit based on a voltage driving method.

The driving circuit driving the light emitting element is based on one of two known methods: a current driving method and a voltage driving method. FIG. 1 shows a configuration of a conventional driving circuit based on the voltage driving method. The driving circuit is composed of a light emitting element 11, a variable resistor R11 that connects an anode terminal of the light emitting element 11 and a power supply (Vcc), and a coupling capacitor C11. A bias current through the light emitting element 11 is determined by the power supply voltage Vcc, a forward voltage at the light emitting element 11, and resistance of the variable resistor R11. An input data signal provides a voltage swing to the light emitting element 11 via the coupling capacitor C11.

The voltage driving method enables the light emitting element to be directly driven by the output from the encoding circuit. Thus, the voltage driving method is more suitable for reducing the size of the optical transmitter than the current driving method, which requires a voltage-current converting circuit.

However, with the reduced power supply voltage Vcc, the conventional voltage-driving-based driving circuit requires the resistance of the variable resistor R11 to be set at a small value in order to obtain a bias current. On the other hand, when the resistance of the variable resistor R11 is reduced, load impedance estimated from the output of the encoding circuit equivalently decreases. This makes it difficult to directly drive the light emitting element 11 on the basis of an output from the encoding circuit or the like.

SUMMARY OF THE INVENTION

The present invention is provided in view of these problems. It is an object of the present invention to provide a driving circuit which can drive a light emitting element in spite of a reduced power supply voltage and which is thus suitable for size reduction.

To accomplish this object, the present invention provides a driving circuit which supplies a bias current to a light emitting element and which carries out modulation on the basis of voltage driving, the driving circuit comprising a boosting circuit that increases a power supply voltage, a resistance element connected between an output of the boosting circuit and an anode terminal of the light emitting element, and a capacitive element connected to the anode terminal of the light emitting element to supply a modulation signal to the light emitting element for voltage driving.

With this configuration, the resistance of the resistance element can be increased by using the boosting circuit to increase the power supply voltage. Consequently, the light emitting element can be driven in spite of a reduced power supply voltage.

Further, the resistance element may be a variable resistor, and the driving circuit may further comprise a light receiving element that outputs a current according to an optical output from the light emitting element and a control circuit that can vary the resistance of the resistance element according to the output current from the light emitting element.

Furthermore, the variable resistor may be a digital potentiometer, the control circuit including an analog-digital (A/D) converter can control the digital potentiometer on the basis of a digital signal output from the A/D converter to vary the resistance.

Moreover, the driving circuit may comprise a light receiving element that outputs a current according to an optical output from the light emitting element, and a control circuit that can vary an output voltage from the boosting circuit according to the output current from the light receiving element.

This boosting circuit includes a pulse wide modulation (PWM) circuit that can change the output voltage. The control circuit including an A/D converter can control the PWM circuit on the basis of a digital signal output from the A/D converter to vary the output voltage.

When a digital potentiometer is provided which feeds back the output voltage to the PWM circuit that can vary the output voltage, the control circuit including the A/D converter can control the digital potentiometer on the basis of a digital signal output from the A/D converter to vary the output voltage.

Furthermore, the present invention provides a driving circuit which supplies a bias current to a light emitting element and which carries out modulation on the basis of voltage driving, the driving circuit comprising a boosting circuit that increases a power supply voltage, a first resistance element connected between an output of the boosting circuit and an anode terminal of the light emitting element, a first capacitive element connected to the anode terminal of the light emitting element to supply a modulation signal with a positive phase to the light emitting element for voltage driving, a second capacitive element connected to a cathode terminal of the light emitting element to supply a modulation signal with a negative phase to the light emitting element for voltage driving, and a second resistance element connected between the cathode terminal of the light emitting element and a ground.

With this configuration, the resistance of the first resistance element can be increased by using the boosting circuit to increase the power supply voltage. Consequently, the light emitting element can be driven in spite of a reduced power supply voltage.

Further, with this configuration, the modulation signal with the positive phase and the modulation signal with the negative phase are inputted to provide a voltage swing to the light emitting element. As a result, a double voltage swing can be provided compared to the case that a signal with a single phase is inputted to the light emitting element. Therefore, the light emitting element can be directly driven using an output from an encoding circuit or the like.

DETAILED DESCRIPTION OF PREFERRED EMBODIMENTS

Embodiments of the present invention will be described below in detail with reference to the drawings.

(First Embodiment)

Figure 2:
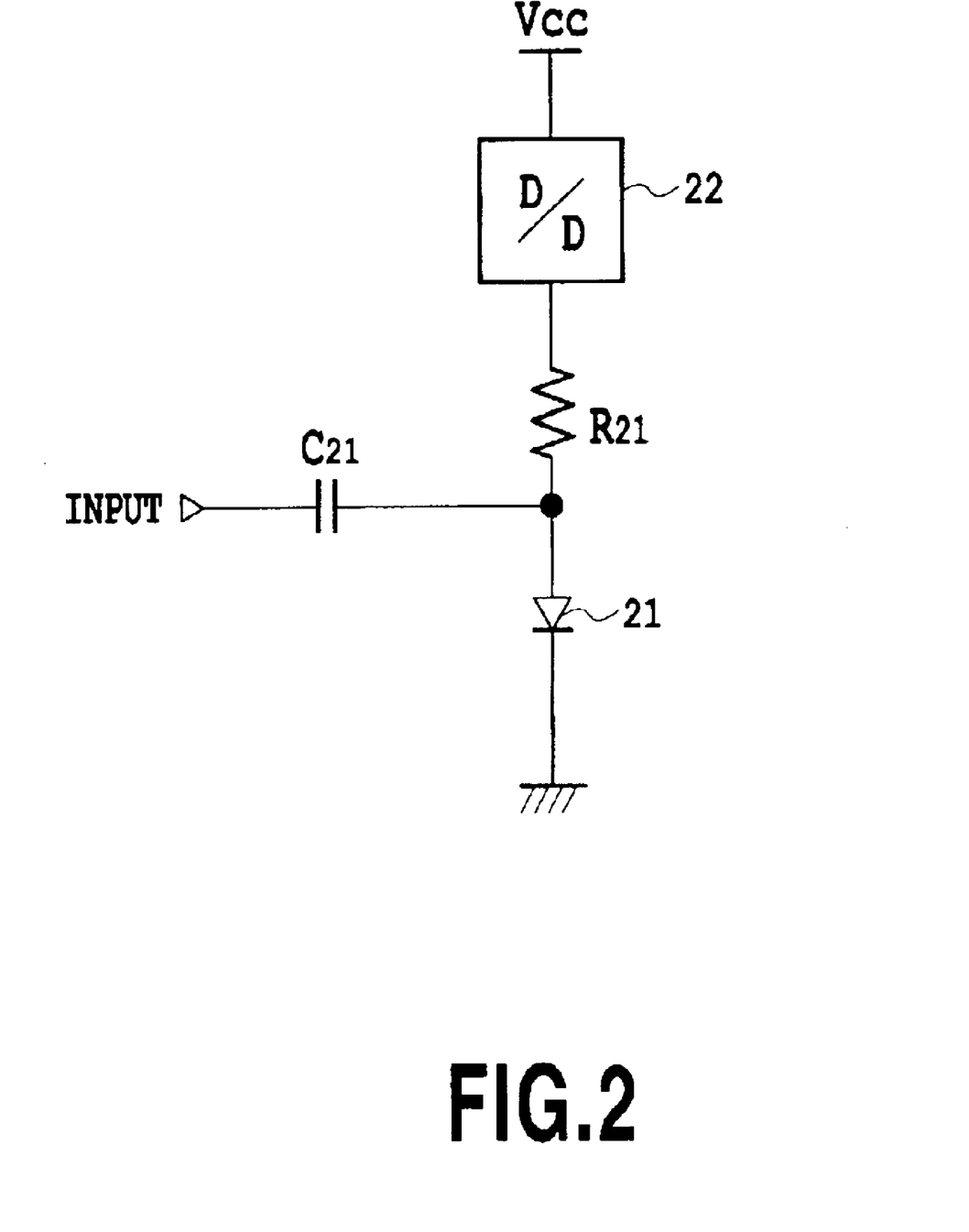
FIG. 2 is a diagram showing a configuration of a driving circuit according to a first embodiment of the present invention.

FIG. 2 shows a configuration of a driving circuit according to a first embodiment of the present invention. The driving circuit is comprised of a light emitting element 21, a resistor R21 connected to an anode terminal of the light emitting element 21, a DC-DC converter 22 connecting the resistor R21 and a power supply (Vcc), and a coupling capacitor C21.

The light emitting elements include, but are not limited to, light emitting diodes and laser diodes. The DC-DC converter 22 is a boosting circuit which increases the power supply voltage Vcc and which supplies the increased power supply voltage Vcc to the resistor R21 and the light emitting element 21. A bias current through the light emitting element 21 is determined by the increased voltage, a forward voltage at the light emitting element 21, and resistance of the resistor R21. An inputted data signal is supplied to the light emitting element 21 via the coupling capacitor C21 as a modulation signal to provide a voltage swing to the element 21.

Figure 3:
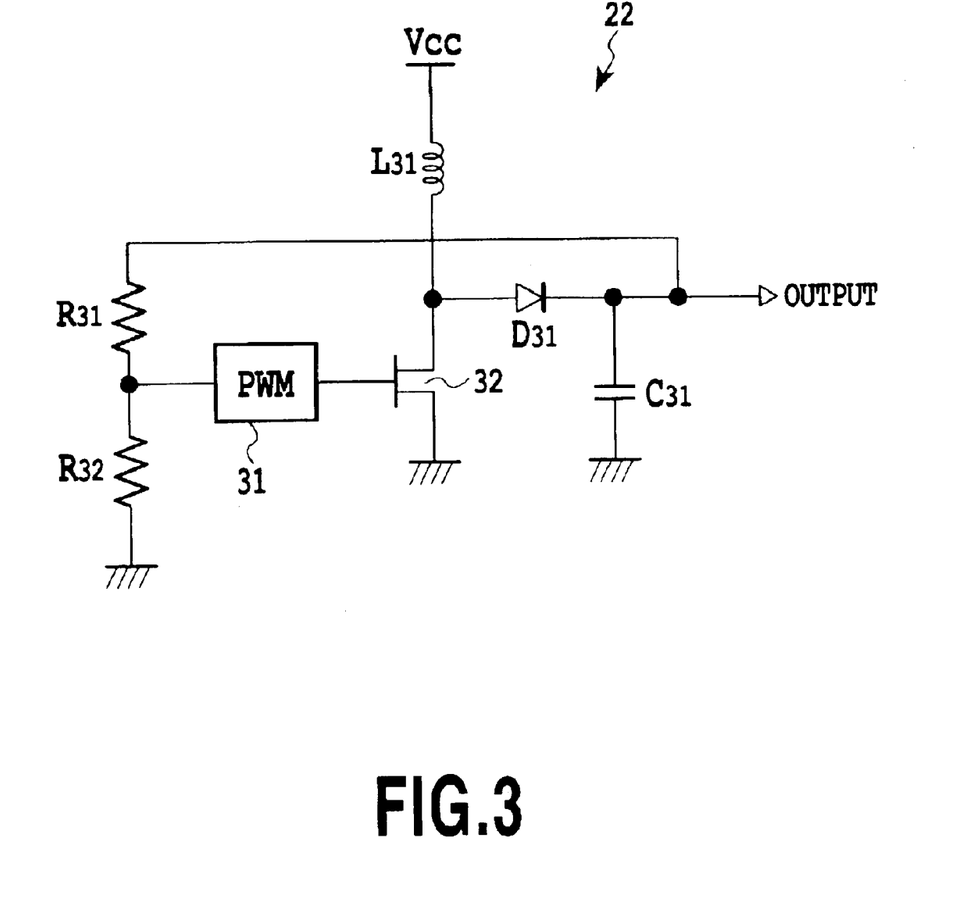
FIG. 3 is a circuit diagram showing a DC-DC converter in the driving circuit according to the first embodiment.

FIG. 3 shows a circuit configuration of the DC-DC converter. In the DC-DC converter 22, a Pulse Width Modulation (PWM) control circuit 31 performs such control as turns on and off a transistor 32 to the DC power supply voltage Vcc into an AC voltage of several dozen kHz. Then, a diode D31 and a capacitor C31 smooth the voltage to convert it back into a DC voltage and then output the resultant voltage. The PWM control circuit 31 use resistors R31 and R32 to feed back its output to perform such control as makes the output voltage constant. In this manner, an arbitrary output voltage can be generated by using the PWM control circuit 31 to control pulse width, frequency, or the like.

According to the present embodiment, the DC-DC converter 22 can increase the power supply voltage Vcc and thus the resistance of the resistor R21. Consequently, the light emitting element can be driven in spite of a reduced power supply voltage.

(Second Embodiment)

Figure 4:
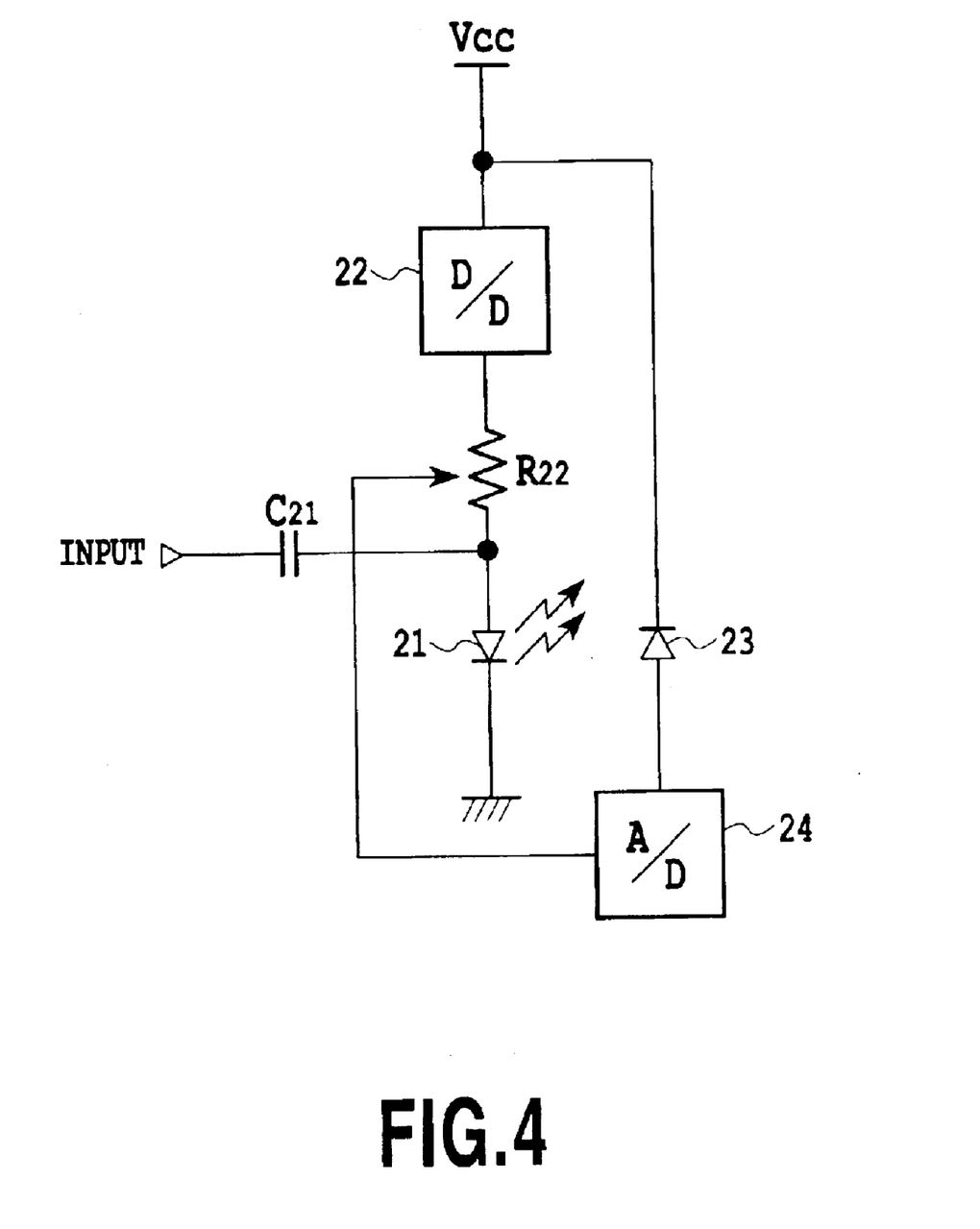
FIG. 4 is a diagram showing a configuration of a driving circuit according to a second embodiment of the present invention.

FIG. 4 shows a configuration of a driving circuit according to a second embodiment of the present invention. The driving circuit is composed of the light emitting element 21, a variable resistor R22 connected to the anode terminal of the light emitting element 21, a DC-DC converter 22 connecting the variable resistor R22 and a power supply (Vcc), and the coupling capacitor C21. The driving circuit further comprises a light receiving element 23 that monitors a portion of an optical output from the light emitting element 21 to output a current corresponding to the optical output, and an A/D converter 24 that converts an output current from the light receiving element 23 into a digital signal.

With this configuration, the A/D converter 24 varies the resistance of the variable resistor R22 according to the output current from the light receiving element 23. This allows the A/D converter 24 to control the bias current through the light emitting element 21 to maintain a constant optical output from the light emitting element 21. The variable resistor R22 uses a digital potentiometer that can be controlled using a digital signal.

The present embodiment uses the A/D converter and the digital potentiometer. However, the optical output from the light emitting element 21 may be controlled to be constant by using an automatic power control (APC) circuit. The APC circuit is composed of a current voltage converting circuit that converts an output current from the light receiving element into a corresponding voltage signal and a combinatorial circuit that can vary the resistance on the basis of the voltage signal.

(Third Embodiment)

Figure 5:
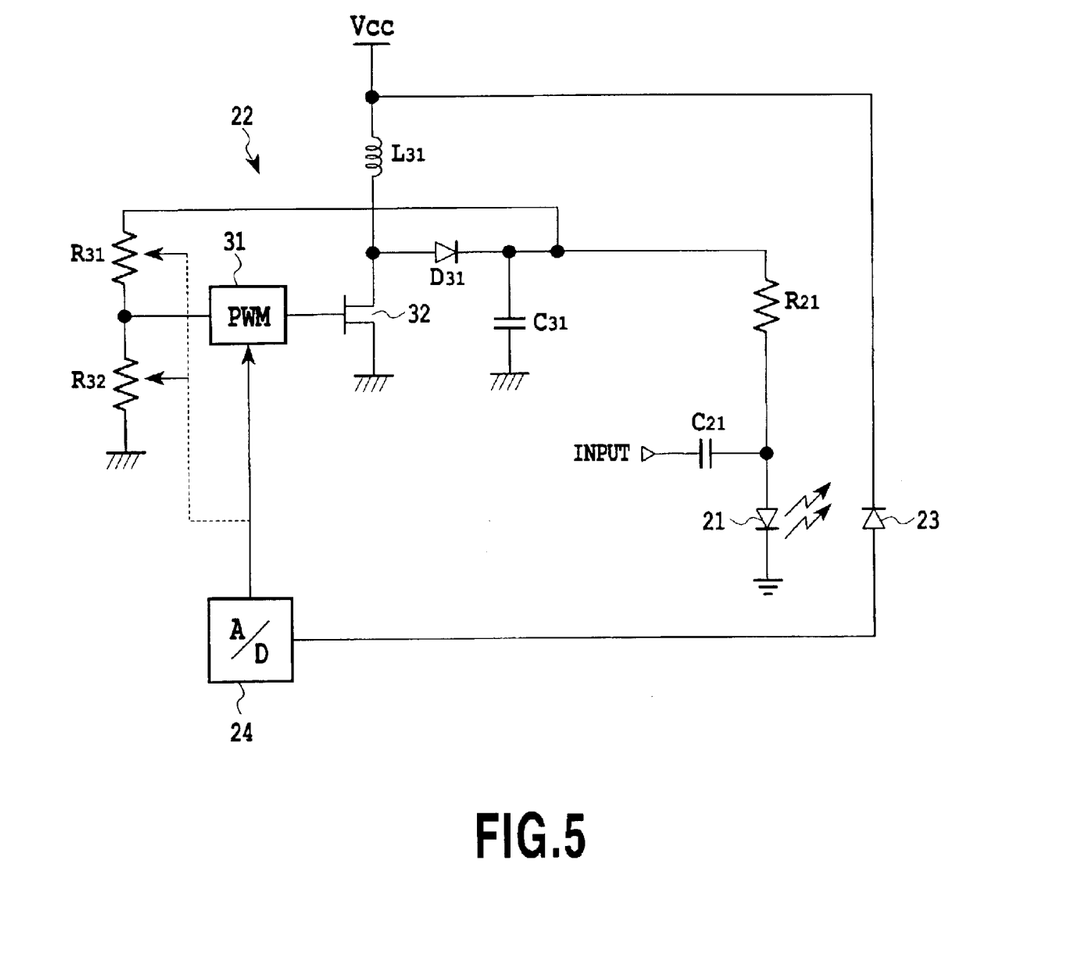
FIG. 5 is a diagram showing a configuration of a driving circuit according to a third embodiment of the present invention.

FIG. 5 shows a configuration of a driving circuit according to a third embodiment of the present invention. The driving circuit is composed of the light emitting element 21, the resistor R21 connected to the anode terminal of the light emitting element 21, the DC-DC converter 22 connecting the resistor R21 and the power supply (Vcc), and the coupling capacitor C21. The driving circuit further comprises the light receiving element 23 that monitors a portion of an optical output from the light emitting element 21 to output a current corresponding to the optical output, and the A/D converter 24 that converts an output current from the light receiving element 23 into a digital signal.

With this configuration, the A/D converter 24 controls the PWM control circuit 31 of the DC-DC converter 22 according to the output current from the light receiving element 23. Thus, the A/D converter 24 sets different values for voltages supplied to the resistor R21 and the light emitting element 21 to control the bias current through the light emitting element 32. The optical output from the light emitting element 21 is therefore kept constant. Alternatively, the resistor R31 or R32 may be a digital potentiometer so that the resistance of the resistor R31 or R32 can be varied depending on an output from the A/D converter 24. Thus, the A/D converter 24 sets different values for voltages supplied to the resistor R21 and the light emitting element 21 to control the bias current through the light emitting element 21.

(Fourth Embodiment)

Figure 6:
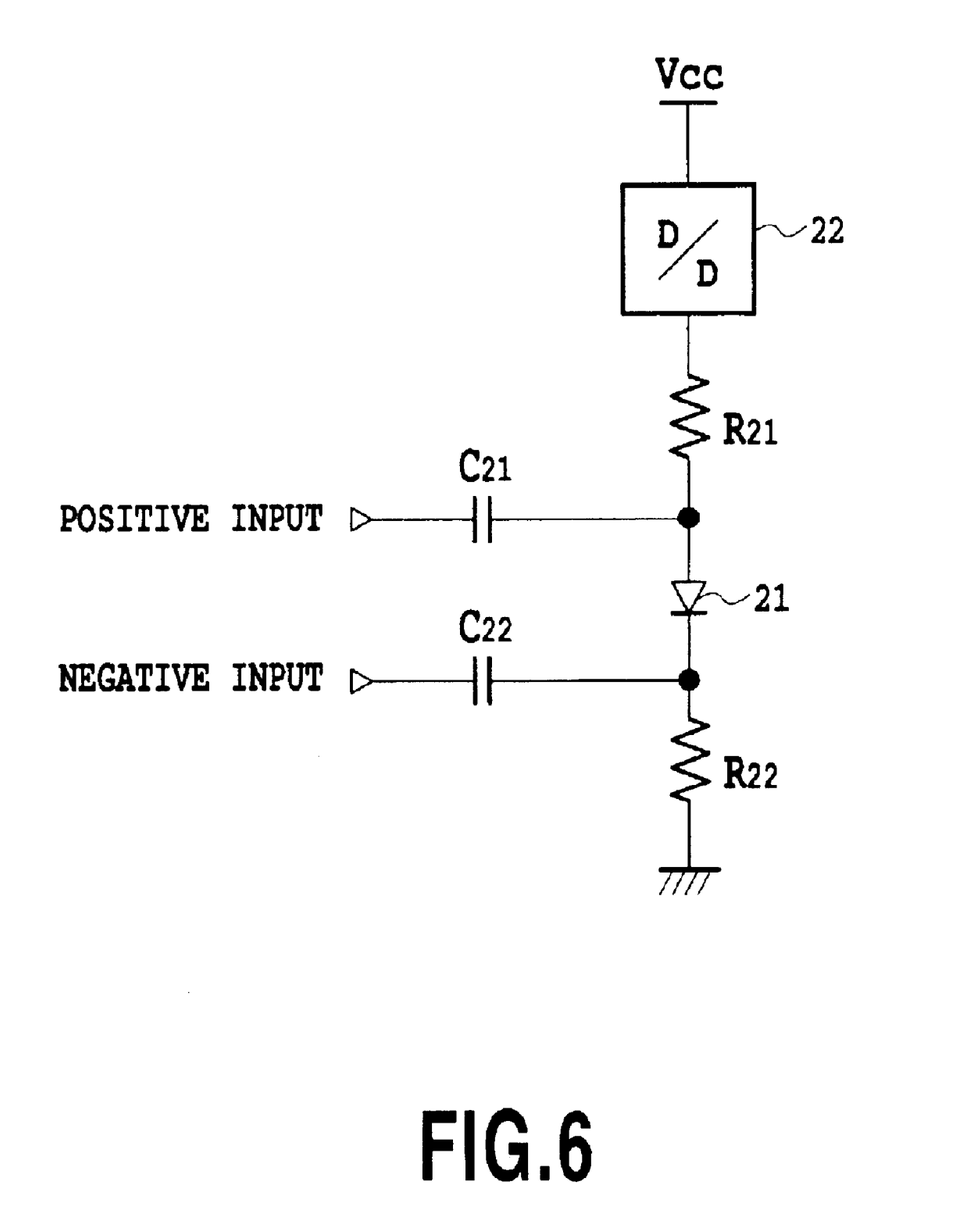
FIG. 6 is a diagram showing a configuration of a driving circuit according to a fourth embodiment of the present invention.

FIG. 6 shows a configuration of a driving circuit according to a fourth embodiment of the present invention. The driving circuit comprises the light emitting element 21, the resistor R21 connected to the anode terminal of the light emitting element 21, the DC-DC converter 22 connecting the resistor R21 and the power supply (Vcc), and the resistor R22 connecting the cathode terminal of the light emitting terminal 21 and the ground. The driving circuit further has coupling capacitors C21 and C22 that provide a positive-phase signal input and a negative-phase signal input from the encoding circuit of the optical transmitter or the like, to the light emitting element 21 as a voltage swing. The DC-DC converter 22 increases the power supply voltage Vcc and supplies the increased power supply voltage Vcc to the light emitting element 21 and the resistors R21 and R22. The bias current is determined by the increased voltage, the forward voltage at the light emitting element 21, and the resistances of the resistors R21 and R22.

The DC-DC converter 22 is configured as shown in FIG. 3. With this configuration, an input data signal provides a voltage swing to the light emitting element 21 via the coupling capacitors C21 and C22 as a modulation signal with a positive phase and a modulation signal with a negative phase. As a result, a double voltage swing can be provided compared to the case that a signal with a single phase is inputted to the light emitting element as in the case with the first embodiment shown in FIG. 2.

According to the present embodiment, the DC-DC converter 22 can increase the power supply voltage Vcc and thus the resistance of the resistor R21. Consequently, the light emitting element can be driven in spite of a reduced power supply voltage. Further, since the resistor R22 can be interposed into the circuit, the light emitting element can be driven using not only the positive-phase signal input but also the negative-phase signal input from the encoding circuit or the like.

(Fifth Embodiment)

Figure 7:
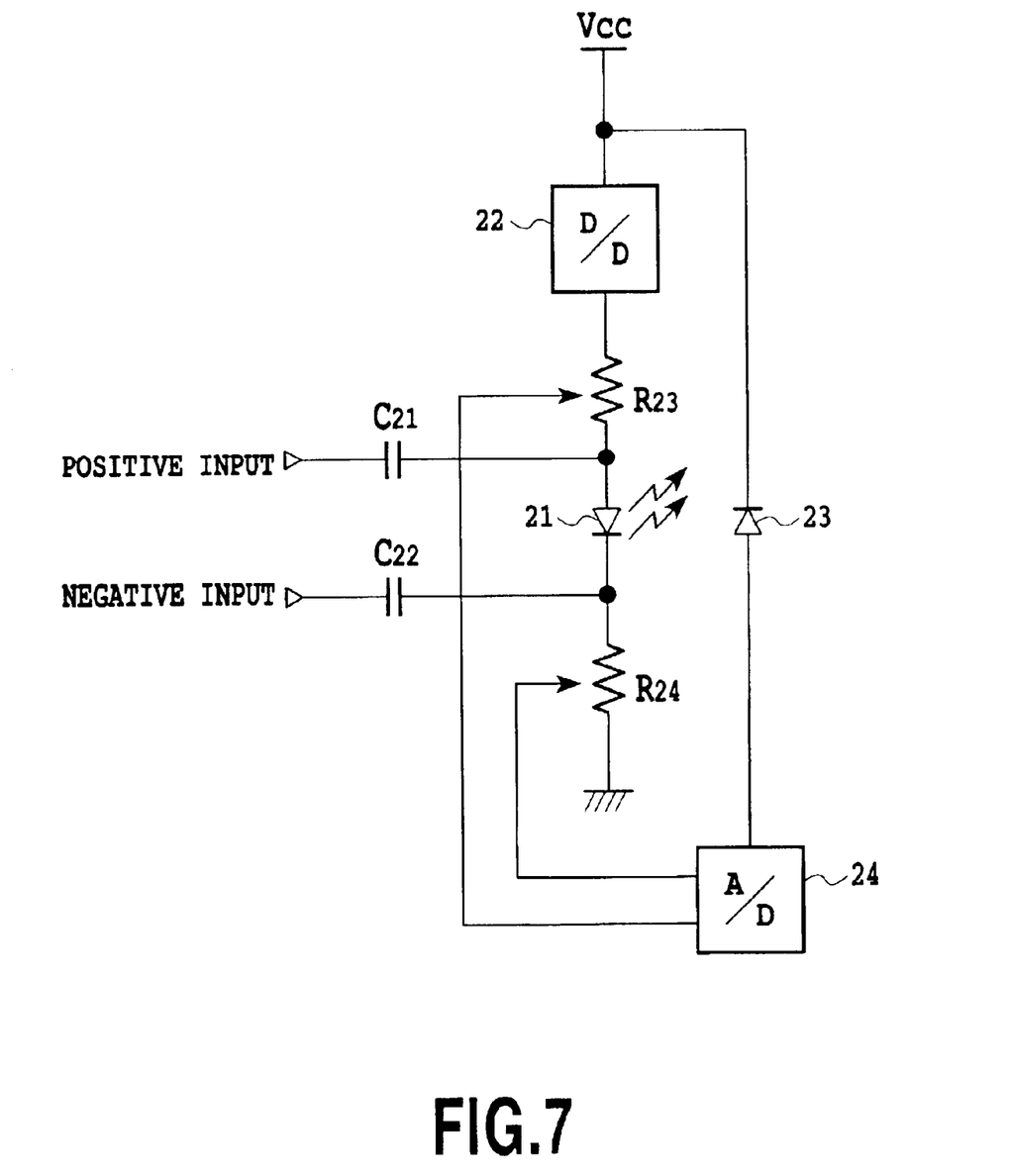
FIG. 7 is a diagram showing a configuration of a driving circuit according to a fifth embodiment of the present invention.

FIG. 7 shows a configuration of a driving circuit according to a fifth embodiment of the present invention. The driving circuit comprises the light emitting element 21, a variable resistor R23 connected to the anode terminal of the light emitting element 21, the DC-DC converter 22 connecting the variable resistor R23 and the power supply (Vcc), and a variable resistor R24 connecting the cathode terminal of the light emitting terminal 21 and the ground. The driving circuit further has the coupling capacitors C21 and C22 that provide a positive-phase signal input and a negative-phase signal input from the encoding circuit of the optical transmitter or the like, to the light emitting element 21 as a voltage swing. Furthermore, the driving circuit comprises the light receiving element 23 that monitors a portion of an optical output from the light emitting element 21 to output a current corresponding to the optical output, and the A/D converter 24 that converts an output current from the light receiving element 23 into a digital signal.

With this configuration, the A/D converter 24 varies the resistances of the variable resistors R23 and R24 according to an output current from the light receiving element 23. Thus, the A/D converter 24 controls the bias current through the light emitting element 21 to maintain a constant optical output from the light emitting element 21. The variable resistors R23 and R24 are each composed of a digital potentiometer that can be controlled by a digital signal.

The present embodiment uses the A/D converter and the digital potentiometer. However, the optical output from the light emitting element 21 may be controlled to be constant by using an APC circuit. The APC circuit is composed of a current voltage converting circuit that converts an output current from the light receiving element into a corresponding voltage signal and a combinatorial circuit that can vary the resistance on the basis of the voltage signal.

(Sixth Embodiment)

Figure 8:
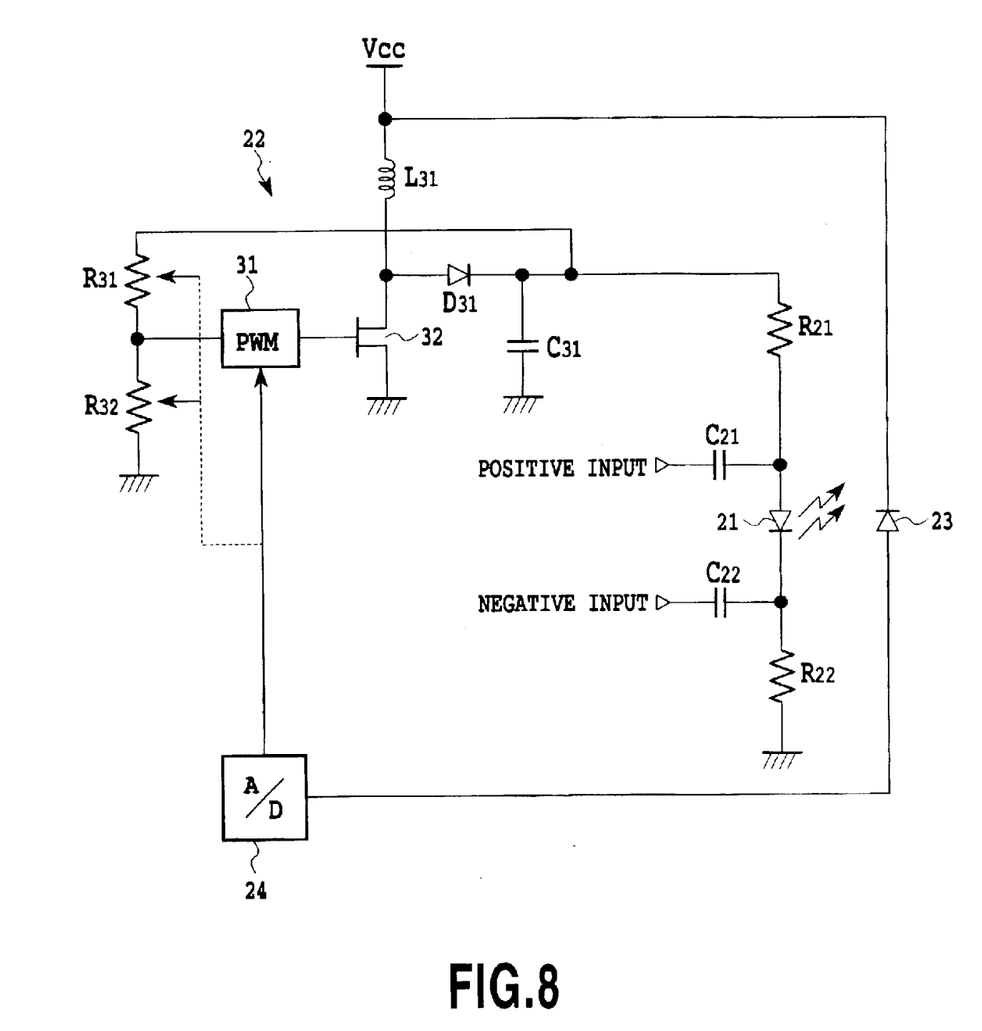
FIG. 8 is a diagram showing a configuration of a driving circuit according to a sixth embodiment of the present invention.

FIG. 8 shows a configuration of a driving circuit according to a sixth embodiment of the present invention. The driving circuit comprises the light emitting element 21, the resistor R21 connected to the anode terminal of the light emitting element 21, the DC-DC converter 22 connecting the resistor R21 and the power supply (Vcc), and the resistor R22 connecting the cathode terminal of the light emitting terminal 21 and the ground. The driving circuit further has the coupling capacitors C21 and C22 that provide a positive-phase signal and a negative-phase signal from the encoding circuit of the optical transmitter or the like, to the light emitting element 21 as a voltage swing. Furthermore, the driving circuit comprises the light receiving element 23 that monitors a portion of an optical output from the light emitting element 21 to output a current corresponding to the optical output, and the A/D converter 24 that converts an output current from the light receiving element 23 into a digital signal.

With this configuration, the A/D converter 24 controls the PWM control circuit 31 of the DC-DC converter 22 according to the output current from the light receiving element 23. Thus, the A/D converter 24 sets different values for voltages supplied to the resistor R21 and the light emitting element 21 to control the bias current through the light emitting element 32. The optical output from the light emitting element 21 is therefore kept constant. Alternatively, the resistor R31 or R32 may be a digital potentiometer so that the resistance of the resistor R31 or R32 can be varied on the basis of an output from the A/D converter 24. Thus, the A/D converter 24 sets different values for voltages supplied to the resistor R21 and the light emitting element 21 to control the bias current through the light emitting element 21.

What is claimed is:

1. A driving circuit for a light emitting element, said driving circuit supplying a bias current and a modulation signal to said light emitting element for voltage driving, said driving circuit comprising:

a boosting circuit that has an output terminal, said boosting circuit boosting a power supply voltage applied thereto and outputting a boosted power supply voltage from said output terminal;

a digital potentiometer connected between said output terminal of said boosting circuit and an anode terminal of said light emitting element;

a capacitive element connected to said anode terminal of said light emitting element to supply said modulation signal to said light emitting element;

a light receiving element for outputting a current corresponding to an optical output emitted from said light emitting element; and a control circuit for varying a resistance of said digital potentiometer based on said current output from said light receiving element;

wherein said control circuit includes an A/D converter that outputs a digital signal and controls said digital potentiometer based on said digital signal output from said A/D converter to vary said resistance.

2. A driving circuit for a light emitting element, said driving circuit supplying a bias current and a modulation signal to said light emitting element for voltage driving, said driving circuit comprising:

a boosting circuit that has an output terminal, said boosting circuit boosting a power supply voltage applied thereto and outputting a boosted power supply voltage from said output terminal;

a digital potentiometer connected between said output terminal of said boosting circuit and an anode terminal of said light emitting element;

a capacitive element connected to said anode terminal of said light emitting element to supply said modulation signal to said light emitting element;

a light receiving element for outputting a current corresponding to an optical output emitted from said light emitting element; and a control circuit for varying a resistance of said digital potentiometer based on said current output from said light receiving element, wherein said boosting circuit includes a PWM circuit, and said control circuit includes an A/D converter that outputs a digital signal and controls said PWM circuit based on said digital signal output from said A/D converter to vary said boosted power supply voltage.

3. The driving circuit according to claim 2, wherein said digital potentiometer that feeds said boosted power supply voltage back to said PWM circuit.

4. A driving circuit for a light emitting element, said driving circuit supplying a bias current and a modulation signal to said light emitting element for voltage driving, said driving circuit comprising:

a boosting circuit that has an output terminal, said boosting circuit boosting a power supply voltage applied thereto and outputting the boosted power supply voltage from said output terminal;

a first resistance element connected between said output terminal of said boosting circuit and an anode terminal of said light emitting element;

a first capacitive element connected to said anode terminal of said light emitting element to supply said modulation signal with a positive phase;

a second capacitive element connected to a cathode terminal of said light emitting element to supply said modulation signal with a negative phase; and a second resistance element connected between said cathode terminal of said light emitting element and a ground.

5. The driving circuit according to claim 4, further comprising a light receiving element for outputting a current corresponding to an optical output emitted from said light emitting element; and a control circuit for varying said boosted power supply voltage output from said boosting circuit based on said current output from said light receiving element.

6. The driving circuit according to claim 5, wherein said boosting circuit includes a PWM circuit that varies said boosted power supply voltage, and said control circuit includes an A/D converter that outputs a digital signal and controls said PWM circuit based on said digital signal output from said A/D converter to vary said boosted power supply voltage.

7. The driving circuit according to claim 5, wherein said boosting circuit includes a PWM circuit that varies said boosted power supply voltage and a digital potentiometer that feeds said boosted power supply voltage back to said PWM circuit, and said control circuit includes an A/D converter that outputs a digital signal and controls said digital potentiometer based on said digital signal output from said A/D converter to vary said boosted power supply voltage.

8. The driving circuit according to claim 4, wherein said first and second resistance elements are variable resistors, and said driving circuit further comprises:

a light receiving element for outputting a current corresponding to an optical output emitted from said light emitting element; and a control circuit for varying resistances of said first and second variable resistors based on said current output from said light receiving element.

9. The driving circuit according to claim 8, wherein each of said first and second variable resistor is a digital potentiometer, and said control circuit includes an A/D converter that outputs a digital signal and controls said digital potentiometer based on said digital signal output from said A/D converter to vary said resistance.

* * * * *